(12) United States Patent
Gao et al.

(10) Patent No.: US 9,673,415 B2
(45) Date of Patent: Jun. 6, 2017

(54) BLUE LIGHT ORGANIC LIGHT-EMITTING DIODE AND DISPLAY INCLUDING SAME

(71) Applicant: EverDisplay Optronics (Shanghai) Limited, Shanghai (CN)

(72) Inventors: Yanpin Gao, Shanghai (CN); Chungche Tsou, Shanghai (CN); Qiguo Zhang, Shanghai (CN); Chuwan Huang, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/799,714

(22) Filed: Jul. 15, 2015

(65) Prior Publication Data

US 2016/0141543 A1 May 19, 2016

(30) Foreign Application Priority Data

Nov. 18, 2014 (CN) .......................... 2014 1 0658552

(51) Int. Cl.
*H01L 51/50* (2006.01)
*H01L 51/52* (2006.01)
*H01L 51/00* (2006.01)

(52) U.S. Cl.
CPC ...... *H01L 51/5088* (2013.01); *H01L 51/5056* (2013.01); *H01L 51/5262* (2013.01);
(Continued)

(58) Field of Classification Search
None
See application file for complete search history.

(56) References Cited

U.S. PATENT DOCUMENTS

2007/0126348 A1 6/2007 Iou
2009/0212688 A1* 8/2009 Song ..................... H01L 51/508
313/504
(Continued)

FOREIGN PATENT DOCUMENTS

CN 100589249 C 2/2010
CN 101904028 A 12/2010
(Continued)

OTHER PUBLICATIONS

The extended European search report issued Apr 22, 2016 by the EP Office.
(Continued)

*Primary Examiner* — Jack Chen
(74) *Attorney, Agent, or Firm* — Yunling Ren

(57) ABSTRACT

The present disclosure provides a blue light organic light-emitting diode, which includes a first electrode layer; a first hole injection layer disposed on the first electrode layer; a second hole injection layer disposed on first hole injection layer; a hole transport layer disposed on the second hole injection layer; a blue light emitting material layer disposed on the hole transport layer; an electron transport layer disposed on the blue light emitting material layer; and a second electrode layer disposed on the electron transport layer, wherein the second hole injection layer has a thickness of 85 nm~105 nm. The present disclosure further provides a display including the device. The blue light organic light-emitting diode of the present disclosure can control blue light energy components having a wavelength less than 435 nm within 0.2%, which reduces the harm of the blue light in the wave band to human eyes to a great extent.

16 Claims, 4 Drawing Sheets

(52) U.S. Cl.
CPC .......... *H01L 51/005* (2013.01); *H01L 51/006* (2013.01); *H01L 51/0058* (2013.01); *H01L 51/0059* (2013.01); *H01L 51/0072* (2013.01); *H01L 51/0078* (2013.01); *H01L 51/0081* (2013.01); *H01L 2251/558* (2013.01)

(56) References Cited

U.S. PATENT DOCUMENTS

| | | |
|---|---|---|
| 2009/0218934 A1 | 9/2009 | Song et al. |
| 2011/0309739 A1* | 12/2011 | Song .................. H01L 51/5088 313/504 |
| 2014/0183496 A1 | 7/2014 | Heo et al. |

FOREIGN PATENT DOCUMENTS

| | | |
|---|---|---|
| CN | 102214794 A | 10/2011 |
| CN | 102273320 A | 12/2011 |
| CN | 202145468 U | 2/2012 |
| CN | 203288658 U | 11/2013 |
| EP | 1018857 A1 | 7/2000 |
| EP | 2075858 A1 | 7/2009 |
| JP | 2003272870 A | 9/2003 |
| JP | 2003338382 A | 11/2003 |
| JP | 2012004116 A | 1/2012 |
| WO | 2014/171313 A1 | 10/2014 |

OTHER PUBLICATIONS

Cited Article:Atomic and Molecular Physics;Fine-tuning the thicknesses of organic layers to realize high-efficiency and long-lifetime blue organic light-emitting diodes.

Cited Article:White top-emitting organic light-emitting diodes with forward directed emission and high color quality.

\* cited by examiner

BLUE LIGHT ORGANIC LIGHT-EMITTING DIODE AND DISPLAY INCLUDING SAME

CROSS REFERENCE TO RELATED APPLICATIONS

The present application claims priority under 35 U.S.C. §119 to Chinese Patent Applications No. 201410658552.1, filed on Nov. 18, 2014, the entire contents of which are incorporated herein by reference.

TECHNICAL FIELD

The present disclosure relates to a blue light organic light-emitting diode (OLED), and more particularly, to a blue light organic light-emitting diode capable of suppressing a specific blue light wavelength.

BACKGROUND

Researches show that blue light having a wavelength less than 435 nm will do a great harm to retina. There is an A2E component in a human retina. The absorption peak of the A2E is located at ultraviolet light 335 nm and visible blue light 435 nm, which is easy to perform photooxidation due to absorption of the blue light, to cause apoptosis, thus causing macular degeneration to human eyes. Moreover, the wavelength of the blue light is shorter, which is easy to cause scattering and dazzle light. The eyes need to focus harder. In the long run, the ciliary muscle is tired and aches, which causes pseudomyopia. In addition, excessive exposure in high energy blue light will affect the living clock of the human body, such that the human body suffers from endocrine dyscrasia and the risk of developing a cancer is increased. This is because that the high energy blue light will reduce the secretion of melatonin of the human body, while the melatonin is an active substance that controls the living clock and the endocrine of the human body. Moreover, the energy of the dark blue light received by the human eyes is 253 times of that of green-yellow light under the same perception luminance, so that the human eyes are hurt by the visible blue light with high energy insensibly.

Therefore, if excessive blue light having a wavelength less than 435 nm comes into the human eyes, the human eyes and an endocrine system will be hurt severely.

FIG. 1 is a light emitting spectrogram of a conventional liquid crystal display (LCD), wherein the energy of the blue light having a wavelength less than 435 nm is very great. However, 3C products (computer, communication and consumer electronics) used in life mostly relate to the foregoing light-emitting devices. As described above, using these displays for a long term will cause asthenopia and pseudomyopia, and more seriously, will even cause retinopathy and living clock disorders and the like.

In order to avoid the hurt of the high energy blue light to the human body, a manner mainly adopted in related art is to paste an anti-blue light protective film on the 3C products. FIG. 2 is a test pattern of UV transmittance of multiple existing protective films, wherein the five curves respectively represent transmittance curves for light having a wavelength of 300~700 nm to pass through anti-blue light films under four different brands (i.e., Benks, JC, Wriol and ZC) and one tempered glass film without an anti-blue light function under the brand of ZC. It can be seen from the figure that about 25% high energy blue light can be suppressed by the anti-blue light protective films, but the transmittance at each wave band is decreased, so that the luminance of the display is affected to some extent.

SUMMARY

In order to solve the foregoing technical problems, the present disclosure provides a blue light organic light-emitting diode, which includes: a first electrode layer; a first hole injection layer disposed on the first electrode layer; a second hole injection layer disposed on the first hole injection layer; a hole transport layer disposed on the second hole injection layer; a blue light emitting material layer disposed on the hole transport layer; an electron transport layer disposed on the blue light emitting material layer; and a second electrode layer disposed on the electron transport layer, wherein the second hole injection layer has a thickness of 85 nm~105 nm.

According to an embodiment of the present disclosure, the second hole injection layer has a thickness of 90 nm.

According to another embodiment of the present disclosure, the first hole injection layer has a thickness of 5 nm~15 nm.

According to another embodiment of the present disclosure, the blue light organic light-emitting diode further includes a light extraction layer disposed on the second electrode layer.

According to another embodiment of the present disclosure, the first electrode layer is selected from an indium tin oxide layer, an indium zinc oxide layer, a tin oxide layer or a zinc oxide layer.

According to another embodiment of the present disclosure, a material of the first hole injection layer includes an arylamine compound or a star amine.

According to another embodiment of the present disclosure, a material of the second hole injection layer includes an arylamine compound or a star amine.

According to another embodiment of the present disclosure, a material of the hole transport layer is selected from an arylenediamine derivative, a starburst compound, a diphenylamine derivative having a spiro group or a ladder-shaped compound.

According to another embodiment of the present disclosure; a material of the blue light emitting material layer is DPVBi doped with BCzVB.

According to another embodiment of the present disclosure, the second electrode layer is an alloy electrode or a composite electrode of metal fluoride and metal, the metal is selected from one of lithium, magnesium, aluminum, calcium, strontium or indium, and the alloy is an alloy formed by one of lithium, magnesium, aluminum, calcium, strontium and indium, and one of copper, gold and silver.

According to another embodiment of the present disclosure, a material of the light extraction layer is selected from an arylenediamine derivative, a starburst compound, a diphenylamine derivative having a spiro group or a ladder-shaped compound.

The present disclosure also provides a blue light organic light-emitting diode, which includes a first electrode layer, an organic functional layer disposed on the first electrode, and a second electrode layer disposed on the organic functional layer, wherein the organic functional layer includes a first hole injection layer and a second hole injection layer, and the first hole injection layer is disposed between the first electrode layer and the second hole injection layer; and the second hole injection layer has a thickness of 85 nm~105 nm.

The present disclosure further provides a display, including the blue light organic light-emitting diode according to any one above.

The blue light organic light-emitting diode of the present disclosure is applied to 3C products, and can control blue light energy components having a wavelength less than 435 nm within 0.2%, which reduces the harm of the blue light in the wave band to human eyes to a great extent, and can also avoid a phenomenon of screen luminance reduction caused by using an anti-blue light protective film.

DESCRIPTION OF THE EMBODIMENTS

Typical embodiments reflecting the characteristics and advantages of the present disclosure will be described below in details. It shall be appreciated that various modifications may be made to different embodiments in the present disclosure without departing from the scope of the present disclosure, and the description herein and drawings are essentially for the purposes of explanation but not for limiting the present disclosure.

Figure 1:
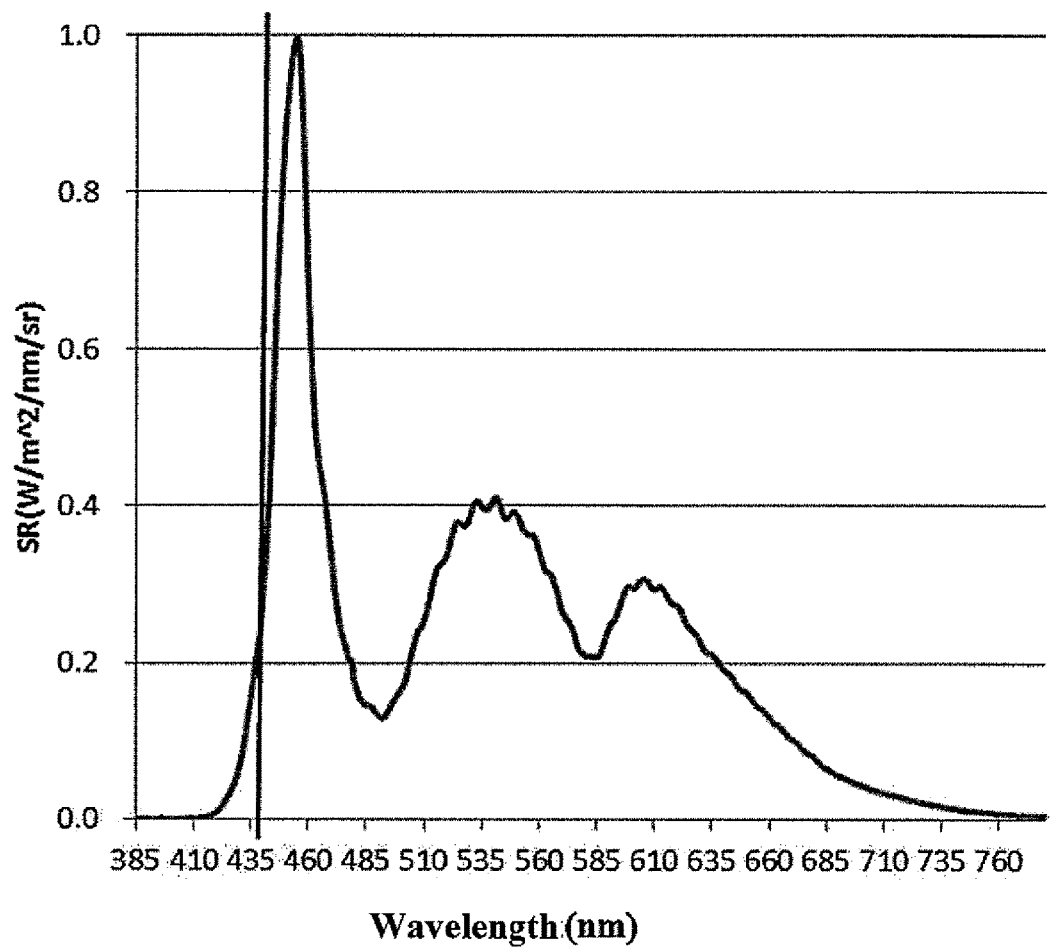
FIG. 1 is a light emitting spectrogram of a conventional LCD.
Figure 2:
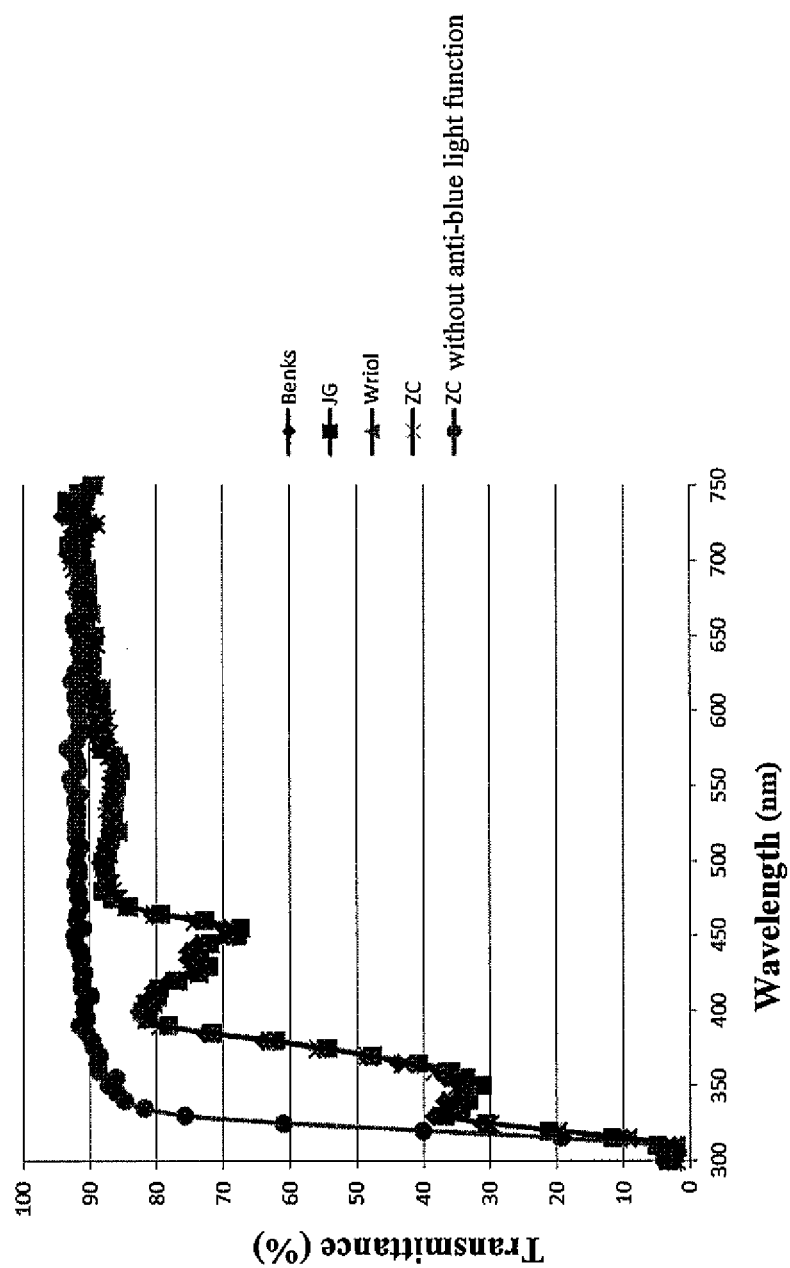
FIG. 2 is a transmittance curve of light having a wavelength of 300~700 nm passing through five existing films used for displays.
Figure 3:
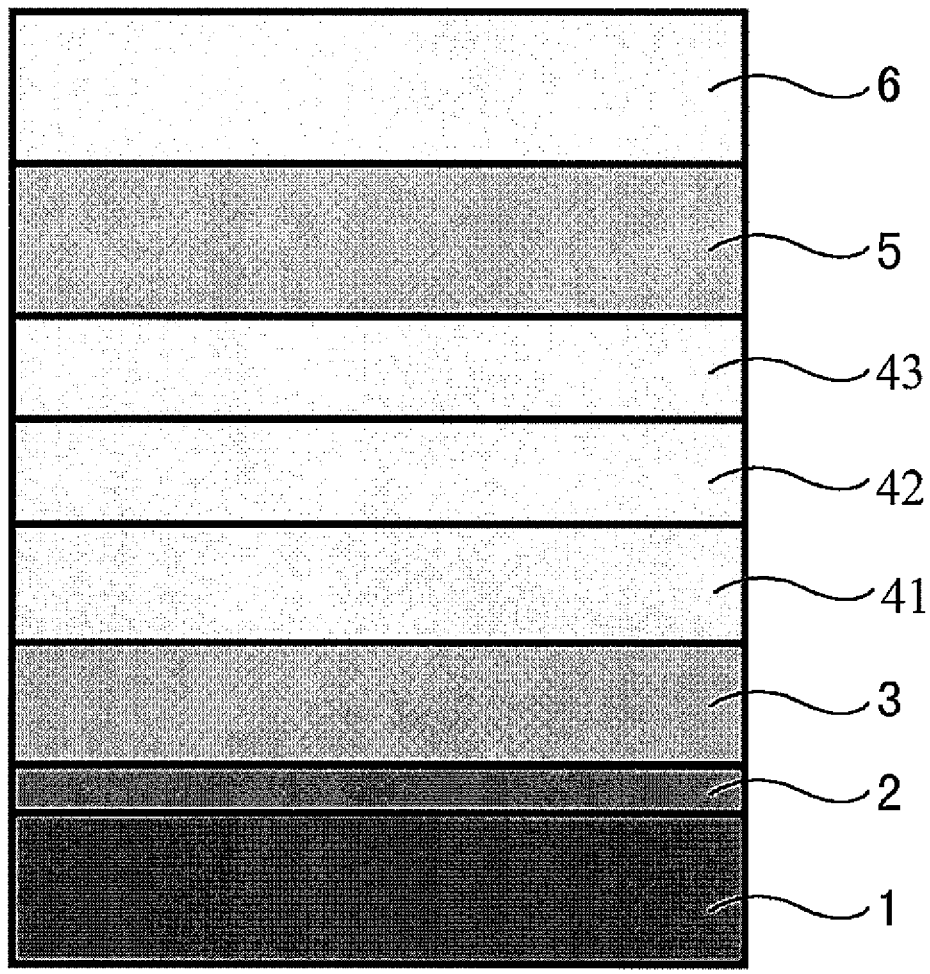
FIG. 3 is a block diagram of an OLED according to an embodiment of the present disclosure.

As shown in FIG. 3, a blue light organic light-emitting diode according to an embodiment of the present disclosure includes: a first electrode layer 1, which may be an anode layer; an organic functional layer disposed on the first electrode layer; and a second electrode layer 5, which may be a cathode layer and disposed on the organic functional layer. The organic functional layer may include: a first hole injection layer 2 disposed on the first electrode layer 1; and a second hole injection layer 3 disposed on the first electrode layer 2; wherein the thickness of the second hole injection layer 3 may be 85 nm~105 nm, preferably 90 nm~95 nm, and more preferably 90 nm.

The organic functional layer may also include but not limited to a hole transport layer 41, a light emitting layer 42, and an electron transport layer 43. The hole transport layer 41 is disposed on the second hole injection layer 3.

In an embodiment of the present disclosure, a light extraction layer 6 arranged on the second electrode layer 5 may also be included.

The first electrode layer 1 may be an indium tin oxide (ITO) layer, an indium zinc oxide layer, a tin oxide layer or a zinc oxide layer, and may also be metal having high work function, for example, Al, Ag, Au and the like. The thickness of the first electrode layer 1 may be 1 nm~500 nm, preferably 30 nm~100 nm. The first electrode layer 1 may be formed through sputtering, vapor deposition, ion beam deposition, evaporation and the like.

Both the first hole injection layer 2 and the second hole injection layer 3 may be formed by evaporation of an arylamine compound or a star amine, specifically 4,4',4"-tris(N-3-methylphenyl-N-phenyl-amino)triphenylamine (m-MTDATA), 1,3,5-tris[4-(3-methyl-phenyl-phenyl-amino)phenyl]benzene (m-MTDATB) and copper phthalocyanine (CuPc). The first hole injection layer 2 has strong hole injection ability, and a material thereof may be for example NPB doped F4-TCNQ. The hole may be injected in a tunneling manner. The injection ability of the second hole injection layer 3 may be related to its HOMO energy level anode work function. Taking ITO/Ag/ITO anode structure as an example, ITO has surface work function of around 5 ev. Accordingly, a material having a HOMO energy level of around 5 ev, for example PEDT:PSS (HOMO=5.0 ev), 2-TNATA (HOMO=5.1 ev), 1-TNATA (HOMO=5.1 ev), and the like, is preferred as the material of the second hole injection layer 3. Moreover, in order to balance the chromaticity coordinate change and blue light suppression effect of the OLED according to the present disclosure to provide best overall effect, the thickness of the first hole injection layer 2 is preferably 5 nm~15 nm, and more preferably 10 nm.

The hole transport layer 41 may be formed by evaporation, and the material thereof may be an arylenediamine derivative, a starburst compound, a diphenylamine derivative having a spiro group or a ladder-shaped compound, specifically N,N-bis(3-methylphenyl)-N,N'-diphenyl-benzidine (TPD), and N,N'-Di-[(1-naphthyl)-N,N'-diphenyl]-1,1'-biphenyl)-4,4'-diamine (NPB). The thickness of the hole transport layer 41 may be 1 nm~200 nm, preferably 5 nm~100 nm The light emitting layer 42 may be formed by evaporation, and the material thereof may be selected from any one of organometallic complex, fused ring aromatic compound, o-phenanthroline compound and carbazole derivative; or the light-emitting material may be doped by fluorescent and phosphorescent dyes. Specifically, the main material may include CBP (4,4-N,N-di-carbazole-biphenyl) and derivative thereof, and mCP (N,N-dicarbazolyl-3,5-benzene) and derivative thereof. The doped material may include phosphorescent organometallic complex having a central metal atom selected from Ir, Pt, Tb and Eu. The phosphorescent organometallic complex may include PQIr, PQIr(acac), PQ2Ir(acac), PIQIr(acac) and PtOEP. The thickness of the light emitting layer 42 may be 5 nm~50 nm, preferably 10 nm~40 nm, and more preferably 15 nm~30 nm.

The light emitting layer 42 may be formed by evaporating a blue light emitting material. The blue light emitting material may be N-arylbenzimidazole, 1,2,4-triazole derivative, 1,3,4-oxadiazole derivative and the like, preferably DPVBi (4,4'-bis(2,2-diphenylvinyl)-1,1'-biphenyl):5% BCzVB (1,4-bis[2-(3-N-ethylcarbazolyl)vinyl]-benzene).

The light emitting layer 42 may also be formed by evaporating a red light emitting material. The red light emitting material may be DCJTB (4-(dicyanomethylene)-2-t-butyl-6-(1,1,7,7-tetramethyljulolidyl-9-enyl)-4H-pyran) doped with Alq3.

The light emitting layer 42 may also be formed by evaporating a green light emitting material. The green light emitting material may be quinacridone doped with Alq3.

The electron transport layer 43 may be formed by evaporation, and the material thereof may be triazine, for example, 4,4'-bis-[2-(4,6-diphenyl-1,3,5-triazinyl)]-1,1'-biphenyl, or 2,4,6-tris(4-biphenylyl)-1,3,5-triazine. The thickness of the electron transport layer 43 may be 1 nm~200 nm, preferably 5 nm~100 nm, and more preferably 20 nm~70 nm.

The thickness of the second electrode layer 5 may be 10 nm~500 nm, and the second electrode layer 5 may be metal, alloy or a composite electrode of metal fluoride and metal; the metal is selected from one of lithium, magnesium, aluminum, calcium, strontium or indium, and the alloy is an alloy formed by one of lithium, magnesium, aluminum, calcium, strontium and indium, and one of copper, gold and silver. The second electrode layer 5 may be formed by evaporation.

The light extraction layer 6 may formed by evaporation of any one of an arylenediamine derivative, starburst compound, a diphenylamine derivative having a spiro group or a ladder-shaped compound. The thickness of the light extraction layer 6 may be 1 nm~100 nm, preferably 30 nm~80 nm.

The materials, thicknesses and formation manners of each layer mentioned above in the present disclosure are not limited to the above-described. The blue light organic light-emitting diode according to embodiments of the present disclosure and the method for preparing the same will be further described in embodiments below, wherein respective layers are formed by evaporation, and all the materials used, such as HAT-CN (Dipyrazino[2,3-f:2',3'-h]quinoxaline-2,3,6,7,10,11-hexacarbonitrile), Alq3 (tris(8-hydroxyquinoline)aluminum) and the like, are commercially available.

First Embodiment

An ITO film having a thickness of 150 nm for example is formed on a glass substrate; an Ag film and an ITO film, which have a thickness of 150 nm (Ag) and 15 nm (ITO), respectively, are sequentially formed on the ITO film and the ITO/Ag/ITO complex film serves as an anode.

An HAT-CN is evaporated on the anode layer as a first hole injection layer. The thickness of the first hole injection layer may be 10 nm.

An NPB film with 3% HAT-CN doped is evaporated on the first hole injection layer as a second hole injection layer. The thickness of the second hole injection layer may be 85 nm.

A TPD film is formed on the second hole injection layer as a hole transport layer. The thickness of the hole transport layer may be 20 nm.

A film formed by evaporating a mixture of DPVBi:5% BCzVB on the hole transport layer serves as a blue light emitting material layer. The thickness of the blue light emitting material layer may be 25 nm.

An Alq3 layer is evaporated on the blue light emitting material layer as an electron transport layer. The thickness of the electron transport layer is 35 nm, for example.

A Mg/Ag film is formed on the electron transport layer as a cathode layer. The thickness of the cathode layer may be 15 nm, for example.

Finally, an NPB film is formed on the cathode layer as a light extraction layer. The thickness of the light extraction layer may be 60 nm for example. Thus, a blue light organic light-emitting diode S1 is obtained.

Second Embodiment to Fifth Embodiment

Materials used in the preparation method for the blue light organic light-emitting diode according to the second embodiment to the fifth embodiment are identical to that used in the first embodiment; therefore, the description of the same technical contents is omitted. The distinction between the second embodiment to the fifth embodiment and the first embodiment only lies in the thickness of the formed second hole injection layer. Organic light-emitting diodes S2, S3, S4 and S5 are prepared respectively through the second embodiment to the fifth embodiment.

Figure 4:
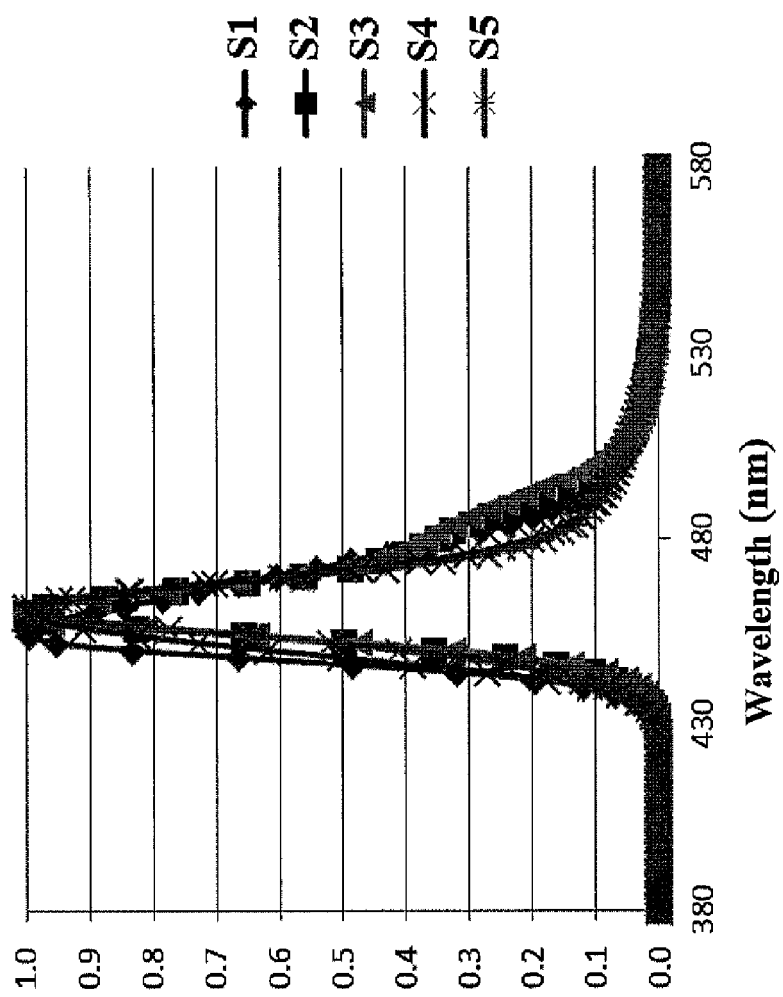
FIG. 4 is an electroluminescent spectra of the blue light organic light-emitting diode which has second hole injection layers of different thicknesses according to the present disclosure.

FIG. 4 is a light-emitting spectrogram of the blue light organic light-emitting diodes prepared in the first embodiment to the fifth embodiment, in which the Y-coordinate represents contrast values. Given the maximum of each curve is 1, the ratio of each point of the curves to the maximum is the Y-coordinate in FIG. 4. Moreover, the energy of the blue light having a wavelength less than 435 nm, the percentage of the energy and the chromaticity coordinate of the organic light-emitting diode according to each embodiment as well as the thickness of the second hole injection layer in each organic light-emitting diode are all listed in Table 1.

TABLE 1

| Devices | Thickness (nm) | Radiance of the energy of the blue light having a wavelength less than 435 nm [Wsr−1 m−2] | Percentage of the energy of the blue light having a wavelength less than 435 nm | CIE_X | CIE_Y |
| --- | --- | --- | --- | --- | --- |
| S1 | 85 | 0.105 | 0.54% | 0.139 | 0.0528 |
| S2 | 90 | 0.00717 | 0.08% | 0.1328 | 0.0667 |
| S3 | 95 | 0.02359 | 0.21% | 0.1317 | 0.0711 |
| S4 | 99 | 0.05699 | 0.46% | 0.1391 | 0.0526 |
| S5 | 104 | 0.06158 | 0.51% | 0.1371 | 0.0549 |

The percentage of the energy in Table 1 represents a ratio of the energy of the blue light having a wavelength less than 435 nm to the energy of white light spectrum of the devices in a visible light region having a wavelength of 380 nm~780 nm. The data of Table 1 shows that, when the thickness of the second hole injection layer of the light-emitting diode is between 85 nm and 104 nm, preferably between 90 nm and 95 nm, the energy of the blue light having a wavelength less than 435 nm is relatively weaker, and the percentage is smaller, and the chromaticity coordinate is better; and when the thickness of the second hole injection layer is 90 nm, the above-mentioned effects are optimal.

The test results of other embodiments of the OLED according to the present disclosure are similar to that of FIG. 4; therefore, description of the related test results is omitted.

Unless otherwise specified, all the terms used in the present disclosure have the meanings commonly understood by those skilled in the art.

The embodiments described herein are only for exemplary purposes but not for limiting the protection scope of the disclosure, and those skilled in the art may make various substitutions, modifications and improvements within the scope of the present disclosure; therefore, the present disclosure is not limited to the above embodiments, but is only defined by the appended claims.

What is claimed is:

1. A blue light organic light-emitting diode, comprising:
a first electrode layer;
a first hole injection layer disposed on the first electrode layer;
a second hole injection layer disposed on the first hole injection layer;
a hole transport layer disposed on the second hole injection layer;
a blue light emitting material layer disposed on the hole transport layer;
an electron transport layer disposed on the blue light emitting material layer; and
a second electrode layer disposed on the electron transport layer,
wherein the first hole injection layer has a thickness which is substantially equal to 10 nm, and the second hole injection layer has a thickness which is between 90 nm to 95 nm such that a percentage of the energy of blue light having a wavelength less than 435 nm emitted from the blue light organic light-emitting diode is between 0.08%~0.21%.

2. The blue light organic light-emitting diode according to claim 1, further comprising a light extraction layer disposed on the second electrode layer.

3. The blue light organic light-emitting diode according to claim 1, wherein the first electrode layer is selected from an indium tin oxide layer, an indium zinc oxide layer, a tin oxide layer or a zinc oxide layer.

4. The blue light organic light-emitting diode according to claim 1, wherein a material of the first hole injection layer comprises an arylamine compound or a star amine.

5. The blue light organic light-emitting diode according to claim 4, wherein a material of the second hole injection layer comprises an arylamine compound or a star amine.

6. The blue light organic light-emitting diode according to claim 1, wherein a material of the hole transport layer is selected from an arylenediamine derivative, a starburst compound, a diphenylamine derivative having a spiro group or a ladder-shaped compound.

7. The blue light organic light-emitting diode according to claim 1, wherein a material of the blue light emitting material layer is DPVBi doped with BCzVB.

8. The blue light organic light-emitting diode according to claim 3, wherein the second electrode layer is an alloy electrode or a composite electrode of metal fluoride and metal, the metal is selected from lithium, magnesium, aluminum, calcium, strontium or indium, and the alloy is an alloy formed by one of lithium, magnesium, aluminum, calcium, strontium and indium, and one of copper, gold and silver.

9. The blue light organic light-emitting diode according to claim 2, wherein a material of the light extraction layer is selected from an arylenediamine derivative, a starburst compound, a diphenylamine derivative having a spiro group or a ladder-shaped compound.

10. A blue light organic light-emitting diode, comprising a first electrode layer, an organic functional layer disposed on the first electrode layer, and a second electrode layer disposed on the organic functional layer, wherein:
the organic functional layer comprises a first hole injection layer and a second hole injection layer; the first hole injection layer is disposed between the first electrode layer and the second hole injection layer; the first hole injection layer has a thickness which is substantially equal to 10 nm, and the second hole injection layer has a thickness which is between 90 nm to 95 nm such that a percentage of the energy of blue light having a wavelength less than 435 nm emitted from the blue light organic light-emitting diode is between 0.08%~0.21%.

11. A display, comprising a blue light organic light-emitting diode;
wherein the blue light organic light-emitting diode comprises:
a first electrode layer;
a first hole injection layer disposed on the first electrode layer;
a second hole injection layer disposed on the first hole injection layer;
a hole transport layer disposed on the second hole injection layer;
a blue light emitting material layer disposed on the hole transport layer;
an electron transport layer disposed on the blue light emitting material layer; and
a second electrode layer disposed on the electron transport layer,
wherein the first hole injection layer has a thickness which is substantially equal to 10 nm, and the second hole injection layer has a thickness which is between 90 nm to 95 nm such that a percentage of the energy of blue light having a wavelength less than 435 nm emitted from the blue light organic light-emitting diode is between 0.08%~0.21%.

12. The display according to claim 11, wherein the blue light organic light-emitting diode further comprises a light extraction layer disposed on the second electrode layer.

13. The display according to claim 11, wherein the first electrode layer is selected from an indium tin oxide layer, an indium zinc oxide layer, a tin oxide layer or a zinc oxide layer.

14. The display according to claim 11, wherein a material of the first hole injection layer comprises an arylamine compound or a star amine.

15. The display according to claim 14, wherein a material of the second hole injection layer comprises an arylamine compound or a star amine.

16. The display according to claim 11, wherein a material of the hole transport layer is selected from an arylenediamine derivative, a starburst compound, a diphenylamine derivative having a spiro group or a ladder-shaped compound.

* * * * *